United States Patent
Jeanneteau et al.

(10) Patent No.: US 11,035,575 B2
(45) Date of Patent: Jun. 15, 2021

(54) POWER MODULE AND COOKING APPLIANCE

(71) Applicant: ELECTROLUX APPLIANCES AKTIEBOLAG, Stockholm (SE)

(72) Inventors: Laurent Jeanneteau, Forli (IT); Alex Viroli, Forli (IT); Massimo Nostro, Forli (IT); Fabio Angeli, Forli (IT)

(73) Assignee: Electrolux Appliances Aktiebolag, Stockholm (SE)

( * ) Notice: Subject to any disclaimer, the term of this patent is extended or adjusted under 35 U.S.C. 154(b) by 0 days.

(21) Appl. No.: 16/636,526

(22) PCT Filed: Jul. 27, 2018

(86) PCT No.: PCT/EP2018/070459
§ 371 (c)(1),
(2) Date: Feb. 4, 2020

(87) PCT Pub. No.: WO2019/034393
PCT Pub. Date: Feb. 21, 2019

(65) Prior Publication Data
US 2020/0386411 A1 Dec. 10, 2020

(30) Foreign Application Priority Data
Aug. 14, 2017 (EP) .................................... 17186190

(51) Int. Cl.
*F24C 7/08* (2006.01)
*F24C 7/06* (2006.01)
(Continued)

(52) U.S. Cl.
CPC .............. *F24C 7/083* (2013.01); *F24C 7/067* (2013.01); *F24C 7/087* (2013.01); *H02M 1/44* (2013.01);
(Continued)

(58) Field of Classification Search
CPC ........ H05B 6/065; H05B 6/1272; H05B 6/04; Y02B 40/00; Y02B 40/126
(Continued)

(56) References Cited

U.S. PATENT DOCUMENTS

2003/0094448 A1 5/2003 Shukla et al.
2004/0256378 A1* 12/2004 Shukla ..................... H05B 3/68
219/490
(Continued)

FOREIGN PATENT DOCUMENTS

GB 2348750 A 10/2000

OTHER PUBLICATIONS

International Search Report and Written Opinion in PCT/EP2018/070459 dated Nov. 15, 2018, 8 pages.

*Primary Examiner* — Thien S Tran
(74) *Attorney, Agent, or Firm* — Pearne & Gordon LLP

(57) ABSTRACT

The invention relates to a power module, preferably induction module for powering one, two, three, four, at least one, at least two, at least three or at least four heating element (s), preferably electrical, radiant and/or induction heating elements, more preferably induction coils (3), of a cooking appliance, preferably a cooking hob, more preferably a radiant or induction hob (1), the power module (10) at least comprising: —one, two or at least two heating power units (11), in particular three or at least three heating power units, more in particular four or at least four heating power units, preferably heating frequency units and/or induction generators (11), each for providing power, in particular electrical power, to one, two, three, at least one, at least two or at least three heating elements (3); —one or at least one controller (12) for controlling the heating power unit(s) (11); —a communication interface (13) for coupling the power module (10) with one or at least one user interface (5); —wherein, in particular in a first configuration mode, the (Continued)

power module (10) is adapted to be operated either according to a master module configuration or a slave module configuration and/or—wherein, in particular in a second configuration mode, the power module (10) is configured to directly communicate with the at least one user interface, a corresponding cooking appliance as well as a corresponding method for operating a cooking appliance.

25 Claims, 3 Drawing Sheets

(51) Int. Cl.
*H02M 1/44* (2007.01)
*H02M 7/04* (2006.01)
*H05B 6/04* (2006.01)
*H05B 6/06* (2006.01)
*H05B 6/44* (2006.01)
*H05K 7/20* (2006.01)

(52) U.S. Cl.
CPC ............... *H02M 7/04* (2013.01); *H05B 6/04* (2013.01); *H05B 6/065* (2013.01); *H05B 6/44* (2013.01); *H05K 7/20909* (2013.01); *H05B 2213/03* (2013.01)

(58) Field of Classification Search
USPC ............... 219/433, 448.11, 448.17, 497, 627
See application file for complete search history.

(56) References Cited

U.S. PATENT DOCUMENTS

| | | | |
|---|---|---|---|
| 2009/0139980 A1* | 6/2009 | Acero Acero | H05B 6/065 219/489 |
| 2012/0294990 A1 | 11/2012 | Graber et al. | |
| 2013/0284722 A1* | 10/2013 | Viroli | H05B 6/065 219/622 |
| 2014/0014649 A1* | 1/2014 | Chavan | F24C 15/101 219/620 |
| 2014/0166641 A1 | 6/2014 | Pastore et al. | |
| 2016/0235239 A1* | 8/2016 | Patadia | A47J 27/08 |

* cited by examiner

POWER MODULE AND COOKING APPLIANCE

The present invention relates to the field of cooking appliances, in particular cooking hobs or induction cooking devices, especially induction cooking hobs. More specifically, the present invention is related to a power module, in particular an induction module showing improved flexibility of usage in induction hobs with adaptive heating zones as well as cooking hobs or induction hobs with fixed heating zones.

BACKGROUND OF THE INVENTION

Cooking appliances, in particular cooking hobs or induction cooking devices, especially induction hobs for preparing food as such may be known in the prior art. Cooking hobs, especially induction hobs, typically comprise at least one heating zone which is associated with at least one heating element, in particular with at least one induction coil. For example, for heating a piece of cookware placed on the heating zone by an induction coil, the induction coil is coupled with electronic driving means of a heating power unit, preferably of a heating frequency unit, for driving an AC current through the induction coil. Said AC current generates a time varying magnetic field. Due to the inductive coupling between the induction coil and the piece of cookware placed above the induction coil, the magnetic field generated by the induction coil causes eddy currents circulating in the piece of food or cookware. The presence of said eddy currents generates heat within the piece of food or cookware due to the electrical resistance of said piece of food or cookware.

Induction hobs, for example, may comprise multiple induction coils arranged in an induction coil array. The induction coil array may extend over the whole or essentially the whole cooking surface of the induction hob. For heating a piece of cookware placed on the induction hob array, the induction hob may be adapted to detect, which hob induction coils of said induction hob array are occupied by the piece of cookware in order to power only the occupied hob induction coils. Alternatively, the heating zone may be configured manually by user input at a user interface. Each induction coil or a group of induction coils may be coupled with an induction module which is adapted to provide electrical power to said induction coils.

SUMMARY OF THE INVENTION

It is an objective of the embodiments of the invention to provide a power module, in particular an induction module with enhanced flexibility in usage. The objective is solved in particular by the features of the independent claims. Preferred embodiments are given in the dependent claims. If not explicitly indicated otherwise, embodiments and features of the invention can be freely combined with each other.

According to an aspect, the invention relates to a power module, preferably an induction module for powering one, two, three, four, at least one, at least two, at least three or at least four heating element(s), preferably electrical, radiant and/or induction heating elements, more preferably induction coils, of a cooking appliance, preferably of a cooking hob, more preferably of a radiant or induction hob, in particular according to the invention, the power module at least comprising:
  one, two or at least two heating power units, in particular three or at least three heating power units, more in particular four or at least four heating power units, preferably heating frequency units and/or induction generators, each for providing power, in particular electrical power, to one, two, three, at least one, at least two or at least three heating elements;
  one or at least one controller for controlling the heating power unit(s);
  a communication interface for coupling the power module with one or at least one user interface;
  wherein preferably, in particular in a first configuration mode, the power module is adapted to be operated either according to a master module configuration or a slave module configuration.

According to a further aspect, the invention relates to a power module, preferably induction module for powering one, two, three, four, at least one, at least two, at least three or at least four heating element(s), preferably electrical, radiant and/or induction heating elements, more preferably induction coils, of a cooking appliance, preferably a cooking hob, more preferably a radiant or induction hob, in particular according to the invention, the power module at least comprising:
  one, two or at least two heating power units, in particular three or at least three heating power units, more in particular four or at least four heating power units, preferably heating frequency units and/or induction generators, each for providing power, in particular electrical power, to one, two, three, at least one, at least two or at least three heating elements;
  one or at least one controller for controlling the heating power unit(s);
  a communication interface for coupling the power module with one or at least one user interface;
  wherein, in particular in a second configuration mode, the power module is configured to directly communicate with the at least one user interface.

According to an aspect, the invention relates to at least one, in particular one or two, induction modules, each for powering two or four induction heating elements, more preferably induction coils, of an induction hob, in particular according to the invention, the at least one induction module at least comprising:
  two or four heating power units, in particular two heating power units at a first induction module and four heating power units at a second induction module, preferably heating frequency units and/or induction generators, each for providing electrical power to one heating element;
  a controller for controlling the heating power units;
  a communication interface for coupling the induction module with a user interface;
  wherein, in particular in a first configuration mode, the induction module is adapted to be operated either according to a master module configuration or a slave module configuration.

According to an aspect, the invention relates to at least two, in particular two or three, induction modules, each for powering four heating elements, preferably induction heating elements, more preferably induction coils, of an induction hob, in particular according to the invention, each of the at least two induction modules at least comprising:
  four heating power units, in particular four heating power units at a first induction module and four heating power units at a second induction module, preferably heating frequency units and/or induction generators, each for providing electrical power to one heating element;
  a controller for controlling the heating power units;

a communication interface for coupling the induction module with a user interface;

wherein, in particular in a first configuration mode, the induction module is adapted to be operated either according to a master module configuration or a slave module configuration.

In particular, a power module can be an essentially rectangular unit which carries at least essentially all electrical components and assembly units which for generating the driving energy for the electric heating element. The power module can especially be an induction module and/or a radiant heating module. In an embodiment, two, three, at least two or at least three power modules are combined to supply a cooking hob with heating energy.

In particular, a heating power unit generates the energy which is necessary for operating the heating element, in particular the coil. In particular, the heating power unit can comprise a converter. A converter in particular converts an electrical input control signal with a high frequency of preferably more than 10 kHz from a controller into a voltage signal for supplying an oscillation circuit with power. In particular, the heating power unit can comprise a resonant or quasi-resonant converter. A resonant converter can use a single switching element, whereas a quasi-resonant converter can use two switching elements, which are in particular constituted by IGBTs.

In particular, a heating element is or can be an element which causes the generation of heat for heating the items to be cooked. In a first possible embodiment, the heating element can be an induction element, in particular an induction coil, which generates heat within a cooking vessel which in turn heats the items to be cooked. In this case, the heat energy is, in particular, essentially transferred by magnetic fields. In particular, the magnetic fields have a frequency of more than 10 kHz. In a second embodiment, the heating element can be a radiant heating element which heats up a cooking surface which heats up the cooking vessel by radiation energy which in turn heats the items to be cooked.

In particular, in the master module configuration, the power module is configured to receive user interface information from the at least one user interface and provide operation information to one or more slave power modules based on said user interface information.

In an embodiment, in the slave module configuration, the power module is configured to receive operation information from a master power module and operate the heating power unit according to said operation information.

Especially, in said slave module configuration, the power module does not consider information directly provided by the user interface.

In particular, the one or at least one controller is adapted to operate the power module at least according to the first configuration mode and a second configuration mode.

In particular, in the second configuration mode, the power module is configured to directly communicate with the at least one user interface.

Said power module, especially said induction module, is advantageous because due to the configuration capabilities, specifically using a software configuration of the power module, the power module can be used in common hobs, in particular in common induction hobs with fixed heating zones in which the power modules directly receive information from the user interface as well as in hobs with a flexible heating zone configuration. Thereby, the flexibility of usage of said power module is increased leading to reduced production and storage costs.

According to embodiments, in said slave module configuration, the power module does not consider information directly provided by the user interface. In other words, the power modules included in the cooking hob are coupled with each other and with the user interface using a single communication bus. So, in said second configuration mode not only the master power module but also the slave power module receives information directly provided by the user interface. However, the slave power module ignores said information directly provided by the user interface. Thereby it is possible to use a single communication bus for the communication between the power modules and communication between the master power module and the user interface.

According to embodiments, the communication interface is configured to couple the power module with the user interface and one or more further power modules. In other words, a single communication interface is used for communication with the further power modules and the user interface. Thereby, the manufacturing costs of the power modules are further reduced.

According to embodiments, the communication interface is a bus interface for coupling the power module with a communication bus. Said communication bus may be any bus capable of transmitting information between the power modules and between the user interface and the master power module, e.g. serial bus, SP, I2C, RS485 etc.

According to embodiments, the power module comprises storage means for storing information regarding operating the power module according to master module configuration or slave module configuration. Said storage may be any storage means for storing information, e.g. a register, a jumper etc. So, only by an appropriate configuration setting, specifically a software setting, the power module is able to be used according to first configuration mode or second configuration mode. In addition, in case of said second configuration mode, the stored information may indicate if the respective power module should be operated as master power module or slave power module.

In particular, the power module comprises a housing, preferably a plastic housing, for housing the power module.

According to a further aspect, the invention refers to a cooking appliance, preferably cooking hob, more preferably electric, radiant and/or induction hob, in particular for heating, cooking and/or boiling food by means of an electric and/or magnetic field, the cooking appliance comprising:

two, three, four, six, at least two, at least three, at least four or at least six heating elements, preferably electrical, radiant and/or induction heating elements, more preferably induction coils;

two, three, four, six, at least two, at least three, at least four or at least six, preferably hardware-identical, power modules, preferably induction modules, in particular according to the invention, each heating element being coupled with at least one power module, the power modules being configured to provide power, in particular electrical power to one or more heating elements; and at least one user interface for receiving user input;

wherein in particular each power module comprises a communication interface in order to couple the power module with a communication media, in particular a communication bus, wherein preferably at least some of the power modules, more preferably each power module, comprise a controller adapted, in particular in a first configuration mode, to operate the power module according to a master-slave-concept and/or operate the power module either according to a master module configuration or a slave module configuration.

According to a further aspect, the invention refers to a cooking appliance, preferably cooking hob, more preferably electric, radiant and/or induction hob, in particular for heating, cooking and/or boiling food by means of an electric and/or magnetic field, the cooking appliance comprising:

two, three, four, six, at least two, at least three, at least four or at least six heating elements, preferably electrical, radiant and/or induction heating elements, more preferably induction coils;

one, two, three, four, six, at least one, at least two, at least three, at least four or at least six, preferably hardware-identical, power modules, preferably induction modules, each heating element being coupled with at least one power module, the power modules being configured to provide power, in particular electrical power to one or more heating elements; and at least one user interface for receiving user input;

wherein each power module comprises a communication interface in order to couple the power module with a communication media, in particular a communication bus, wherein at least some of the power modules, preferably each power module, comprise a controller adapted to operate the power module according to a master-slave-concept and/or wherein at least some of the power modules, preferably each power module, comprise a controller adapted to communicate directly with the user interface.

According to a further aspect, the invention refers to an induction hob, in particular for heating, cooking and/or boiling food by means of an electric and/or magnetic field, the induction hob comprising:

six induction heating elements, more preferably induction coils;

two, preferably hardware-identical, induction modules, each heating element being coupled to one induction module, the induction modules being configured to provide particular electrical power to four or six heating elements; and a user interface for receiving user input;

wherein each induction module comprises a communication interface in order to couple the induction module with a communication media, in particular a communication bus, wherein at least some of the induction modules, preferably each induction module, comprise a controller adapted, in particular in a first configuration mode, to operate the induction module according to a master-slave-concept and/or operate the induction module either according to a master module configuration or a slave module configuration.

According to a further aspect, the invention refers to an induction hob, in particular for heating, cooking and/or boiling food by means of an electric and/or magnetic field, the induction hob comprising:

eight or twelve induction heating elements, more preferably induction coils;

two or three, preferably hardware-identical, induction modules, each heating element being coupled one power module, the power modules being configured to provide particular electrical power to four or six heating elements; and one, two, three or at least two user interfaces for receiving user input;

wherein each induction module comprises a communication interface in order to couple the induction module with a communication media, in particular a communication bus, wherein at least some of the induction modules, preferably each induction module, comprise a controller adapted, in particular in a first configuration mode, to operate the induction module according to a master-slave-concept and/or operate the induction module either according to a master module configuration or a slave module configuration.

In particular, one of said power modules is configured as master power module, in particular as a master induction module, and at least one further power module is configured as slave power module, in particular as a slave induction module.

Especially, the master power module is adapted to receive user interface information from the at least one user interface and provide operation information to said one or more slave power modules based on said user interface information.

In particular, the slave power module is configured to receive operation information from said master power module and operate at least one, at least two or at least three heating power units, in particular induction generators, according to said operation information.

Said cooking hob, in particular induction hob, is advantageous because there is no need for a central controller because the master power module is configured to take over the task of the central controller. Thereby the structure of the cooking hob is significantly reduced.

According to embodiments, the user interface is adapted to provide user interface information to said one or more slave power modules and said one or more slave power modules are adapted to reject or ignore said user interface information. In other words, only the master power module processes the user interface information and provides operation information to the slave power modules based on said user interface information.

According to embodiments, a single communication bus is used for communication between the master power module and the user interface and for communication between the master power module and the one or more slave power modules. Thereby, the usage of different bus systems for transmission of information between the master power module and the user interface and transmission of information between the master power module and the slave power module can be avoided.

According to embodiments, the master power module is configured to serve as a central controller for grouping induction coils associated with one or more slave modules in order to form a common cooking area based on said group of induction coils. So, based on a user input defining the configuration of the cooking zone or an automatic pot detection mechanism, the master power module may determine the induction coils to be activated and provide respective operating information to the slave power module which are coupled with the induction coils to be activated.

According to embodiments, the master power module is configured to determine operation information including target power and/or operating frequency of said one or more slave power modules based on said user interface information.

According to embodiments, the master power module is configured to determine operation information including target power and/or operating frequency of said one or more slave power modules based on a noise reduction algorithm. Said noise reduction algorithm may reduce acoustic noise by appropriately choosing the target power and/or operating frequency of each induction coil.

According to embodiments, the master power module is configured to transmit information regarding the induction coils to be activated, the target power and/or the operating frequency to said one or more slave power modules. Said information transmission may be performed via the communication bus coupling the master power module with said one or more slave power modules.

According to embodiments, the one or more slave power modules are configured to process the information received from the master power module and operate the one or more induction coils coupled with said slave module according to said received information. For example, the information provided by the master power module may be a broadcast message which is received by all slave modules. The slave modules may activate induction coils according to said information and choose the target power and/or the operating frequency according to the target power or operating frequency information included in said master message.

According to embodiments, the slave power module is adapted to provide feedback information to said master power module in order to inform the master power module about the operation state of the slave power module. The feedback information may comprise information of the AC current frequency, the reached power, regulation parameters and/or zone status flags. Said feedback information may be exchanged regularly or periodically between said power modules and the master power module may be adapted to choose operational settings to be provided to the slave power modules in the next step or next loop cycle based on said feedback information.

In particular, one of said power modules is configured as master power module, in particular master induction module, and at least one further power module is configured as slave power module, in particular slave induction module.

In particular, the master power module is adapted to receive user interface information from the at least one user interface and provide operation information to said one or more slave power modules based on said user interface information.

In particular, the slave power module is configured to receive operation information from said master power module and operate at least one, at least two or at least three heating power units, in particular induction generators, according to said operation information.

In particular, the or the at least one user interface is adapted to provide user interface information to said one or more slave power modules and said one or more slave power modules are adapted to reject or ignore said user interface information.

In particular, a single communication media, in particular a single communication bus, is used for communication between the master power module and the user interface and for communication between the master power module and the one or more slave power modules.

In particular, the master power module is or can be configured to serve as a central controller for grouping heating elements associated with one, two, three, at least two or at least three slave modules in order to form a common cooking area based on said group of heating elements.

In particular, the master power module is or can be configured to determine operation information including target power and/or operating frequency of said one or more slave power modules based on said user interface information and/or based on a noise reduction algorithm.

In particular, the master power module is or can be configured to transmit information regarding the heating elements to be activated, the target power and/or the operating frequency to said one or more slave power modules, in particular wherein the one or more slave power modules are configured to process the information received from the master power module and operate the one or more heating elements coupled with said slave module according to said received information.

In particular, the or each slave power module is adapted to provide feedback information to said master power module in order to inform the master power module about the operation state of the slave power module.

In particular, the cooking appliance, preferably cooking hob, more preferably electric, radiant and/or induction hob, comprises at least two power supply lines, in particular two, three or at least three power supply lines for supplying power to the cooking appliance.

In particular, the power supply lines comprise at least a first power supply line and a second power supply line.

In an embodiment, the power supply lines supply power by means of one or at least one AC voltage input signal with a first frequency, the AC voltage input signal comprising a first voltage phase.

In a further embodiment, the power supply lines supply power by means of two or at least two AC voltage input signals, in particular with a first frequency, the at least two AC voltage input signals comprising at least a first and a second, in particular different, voltage phase.

In particular, the power modules comprise at least a first power module and a second power module.

In particular, each power module is particularly provided as a power board, preferably comprising a power generating circuit and/or mounted on a printed circuit board.

In particular, the power modules, in particular the first and the second power module, receive power from the first and the second power supply line by means of at least one AC voltage input signal.

In particular, at least one or each power module comprises a frequency processing unit.

In an embodiment, the at least one or each power module, especially the frequency processing unit, comprises a filter unit, in particular an electric or electronic filtering circuit, a net filter and/or a line filter, for filtering the at least one AC voltage input signal. The filtering of the at least one AC voltage input signal is in particular intended for attenuating conducted radio frequencies and/or for reducing electromagnetic interference, EMI and/or for maintaining electromagnetic compatibility, EMC.

In an embodiment, the at least one or each power module, especially the frequency processing unit, comprises one, two or at least one rectifying unit, in particular a fullwave-rectifier and/or a bridge rectifier, for rectifying the at least one AC voltage input signal into a DC voltage signal.

The or each DC voltage signal can in particular be supplied to two power rails, wherein one of the two power rails defines a voltage reference potential.

In at least one embodiment, each power module comprises two or at least two heating power units, in particular three or at least three heating power units, more in particular four or at least four heating power units, preferably generators and/or inverters, each provided preferably as a heating frequency unit for generating a heating frequency.

In particular, the at least two heating power units comprise at least a first and a second heating power unit.

Preferably, each heating power unit is supplied with electrical power by two power rails.

In at least one embodiment, the heating power units, in particular the first and the second heating power unit, output electrical signals, preferably with at least a second and a third frequency, wherein more preferably each of the second and the third frequency are at least 100 times higher than the first frequency.

In particular, at least one or each heating power unit comprise one single power switch or two power switches for generating the heating frequency, in particular one or two power switches provided as one or two integrated circuits, more in particular one or two IGBT's or relays.

In particular, at least one or each heating power unit operate a quasi resonant circuit or a half bridge circuit.

At least one or each power module can preferably comprise at least one controller to control the operation of the heating power units.

In at least one embodiment, at least one or each heating power unit are connected or connectable to at least one heating element, in particular by means of at least one line and/or switching device.

At least one or each heating power unit can especially energize at least one oscillating circuit comprising at least one inductive element and at least one capacitive element, in particular at least one coil and at least one capacitor.

In particular, at least one or each heating power unit generates a heating frequency in at least one heating element, in particular in the at least one inductive element or coil.

At least one or each of the at least two power modules can especially comprise at least two, preferably passive, cooling elements, in particular heatsinks for cooling the at least two heating power units and/or the frequency processing unit, more in particular the rectifying unit.

In at least one embodiment, at least one or each of the at least two power modules can comprise at least one active cooling element, in particular at least one cooling fan, preferably for cooling the at least two passive cooling elements.

Especially, the or at least one active cooling element can provide cool air for cooling the cooling elements, in particular the heatsinks.

At least one shielding element, preferably against electric and/or magnetic fields and/or heat radiation, in particular a mica sheet, can especially be arranged above and/or below each heating element, in particular above and/or below each inductive element or coil, of each or at least one power module.

In at least one embodiment, the power module can comprise a, preferably rectangular and/or glass ceramic, cooking surface.

In at least one embodiment, one or at least one user interface can comprise or comprises a display unit and an input unit, in particular for each power module.

In particular, the or each display unit and the or each input unit can be combined to form at least one touch sensitive screen.

The at least one user interface, in particular the display unit and the input unit, can especially be arranged under, at or on the cooking surface.

In particular, the heating elements can be arranged in a matrix form with at least one, at least two or at least three rows and/or with at least one, at least two or at least three columns under the cooking surface.

In at least one embodiment, the at least two power modules are or can be arranged below the cooking surface and/or below the heating elements.

In particular, at least two, preferably at least three, more preferably at least four, cooking zones are arranged and/or arrangeable on the cooking surface.

Each cooking zone can especially be constituted by two, three, four, at least two, at least three or at least four heating elements, wherein in particular each heating element of a cooking zone is operated at the same heating level or with the same power.

In an embodiment, the at least two, preferably at least three, more preferably at least four cooking zones are adaptable to the position, shape and/or size of at least two, at least three or at least four cooking vessels.

At least one, at least two or at least three cooking zones can especially receive or can be configured to receive power from the first and the second power supply line, in particular by means of the first and the second power module.

The heating elements in particular can be formed in such a way that they can be combined to a larger heating zone, more in particular in at least essentially D-shaped, triangular, quadratic, circular and/or eliptical shape.

The heating elements in particular can be arranged, at least partially, in concentrical circuits and/or comprising a linear and/or a rounded part, in particular with a constant radius.

In particular, the two, three, four, at least two, at least three or at least four heating elements can be arranged on at least one heating elements carrying unit, preferably on at least one induction coil carrier plate.

The heating elements carrying unit can especially be carrying and/or supporting ferrite elements and ferrite support elements for guiding the electrical and/or magnetic field of the heating elements.

The or a first power module can preferably comprises a first communication interface and the or a second power module can preferably comprise a second communication interface. The or a user interface can preferably comprise a third communication interface.

In particular, each power module can be configured to communicate, in the slave module configuration, indirectly as a slave power module with the user interface by means of another power module forming a master power module.

Each power module especially can communicates or can be configured to communicate, in the master module configuration, directly with the user interface, especially by using a communication media, for example a communication bus.

In an embodiment, in the master module configuration, the first communication interface preferably communicates with the third communication interface, so that the first power module communicates directly with the user interface by means of the first communication interface and the third communication interface.

In particular, in the slave module configuration, the first communication interface can communicate or communicates with the second communication interface, so that the first power module can communicate or communicates indirectly with the user interface via the second power module by means of the first, the second and the third communication interface.

According to a further aspect, the invention refers to a method for operating a cooking appliance, preferably a cooking hob, more preferably a radiant and/or induction hob, in particular according to the invention, the cooking appliance comprising
- two, three, four, six, at least two, at least three, at least four or at least six heating elements, preferably electrical, radiant and/or induction heating elements, more preferably induction coils,
- two, three, four, six, at least two, at least three, at least four or at least six, in particular hardware-identical, power modules, preferably induction modules,
- each heating element being coupled with an or at least one power module, preferably induction power module, in order to provide, in particular electrical, power to one or more heating elements and
- at least one user interface for receiving user input, the method at least comprising the step of:
- configuring, in particular in a first configuration mode, one power module of said power modules as master power module and at least one further or each further power module as slave module.

According to a further aspect, the invention refers to a method for operating a cooking appliance, preferably a cooking hob, more preferably a radiant and/or induction hob, in particular according to one of the preceding claims, the cooking appliance comprising
- two, three, four, six, at least two, at least three, at least four or at least six heating elements, preferably electrical, radiant and/or induction heating elements, more preferably induction coils,
- two, three, four, six, at least two, at least three, at least four or at least six, in particular hardware-identical, power modules, preferably induction modules,
- each heating element being coupled with an or at least one power module, preferably induction power module, in order to provide, in particular electrical, power to one or more heating elements and
- at least one user interface for receiving user input, the method at least comprising the step of:
- configuring, in particular in a second configuration mode, one, at least one or each power module of said power modules to communicate directly with the at least one user interface.

In particular, the method further comprising at least one or more of the steps of:
- after receiving a user input at the user interface, receiving user interface information at the master power module;
- processing the user interface information at the master power module;
- operating the at least one heating element coupled with said one or more master power modules based on said operation information,
- deriving operation information for said one or more slave power modules based on said user interface information;
- transmitting operation information from the master power module to said one or more slave power modules; and/or
- operating the at least one heating element coupled with said one or more slave power modules based on said operation information.

The terms "essentially", "substantially" or "approximately" as used in the invention means deviations from the exact value by+/−10%, preferably by +/−5% and/or deviations in the form of changes that are insignificant for the function.

BRIEF DESCRIPTION OF THE DRAWINGS

The various aspects of the invention, including its particular features and advantages, will be readily understood from the following detailed description and the accompanying drawings, in which.

DETAILED DESCRIPTION OF PREFERRED EMBODIMENTS

Figure 1:
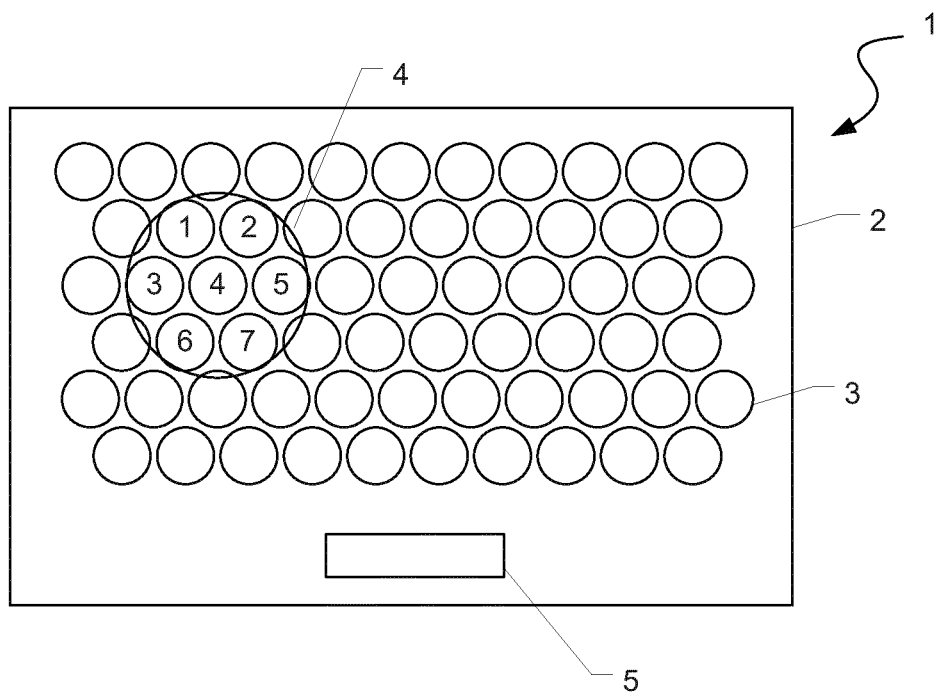
FIG. 1 shows an example schematic top view of an induction hob comprising an induction coil array.

The present invention will now be described more fully with reference to the accompanying drawings, in which example embodiments are shown. However, this invention should not be construed as limited to the embodiments set forth herein. Throughout the following description similar reference numerals have been used to denote similar elements, parts, items or features, when applicable.

FIG. 1 shows an induction hob 1 according to an embodiment. The induction hob 1 comprises a cooking surface 2, e.g. a glass ceramic plate and a plurality of induction coils 3 which are placed beneath the cooking surface 2. The induction coils 3 may be arranged in a matrix-like manner in order to build an induction coil array. The induction coils 3 form heating elements being adapted to heat a piece of cookware 4 placed on the cooking surface 2 by induction heating. By means of said multiple induction coils 3, an induction hob 1 with adjustable heating areas is achieved because by activating a certain subset of said induction coils 3, the size and/or shape of the cooking area can be varied. Said variation of cooking area may be obtained based on user input at a user interface 5 (e.g. touch sensible area, buttons etc.) or based on an automatic pot detection process.

According to said automatic pot detection process, the induction coils 3 are not only used to cook or heat the food contained in the piece of cookware 4, but also to identify the position of the overlying piece of cookware 4. When a piece of cookware 4 is disposed in any position on the induction hob 1, its position is identified, with consequent determination of which induction coils 3 lie below said piece of cookware (according to FIG. 1, induction coils 1 to 7 are placed below the cookware). Only the induction coils 3 being occupied by the piece of cookware 4 will be activated during heating the piece of cookware 4.

Figure 2:
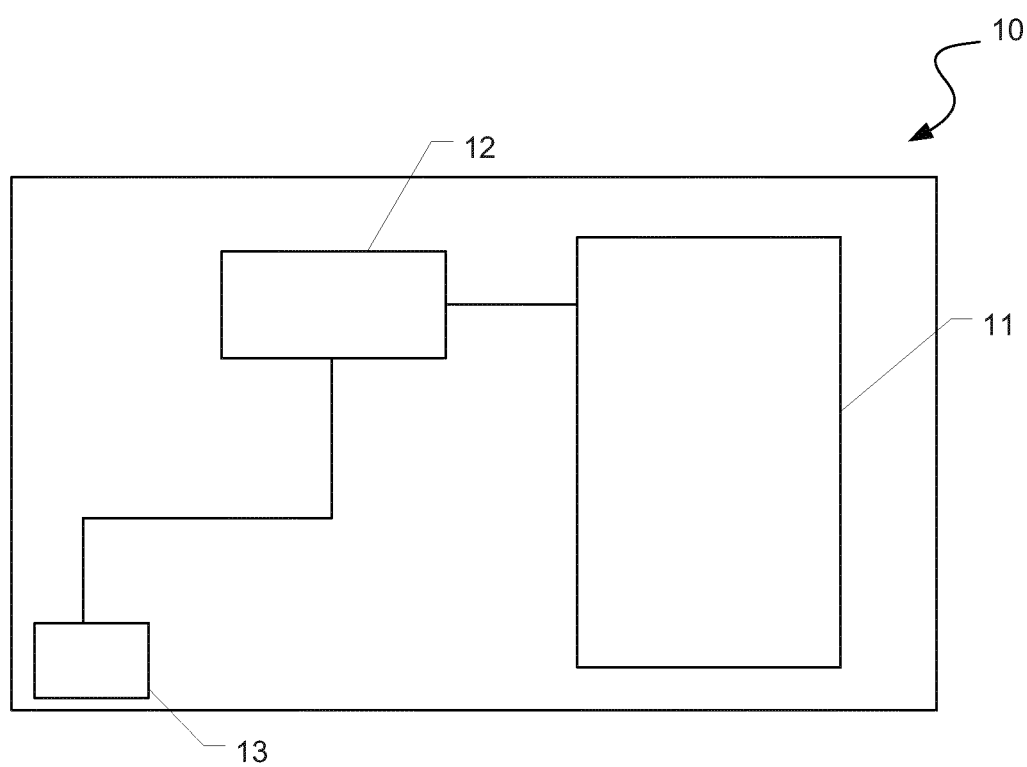
FIG. 2 shows an example schematic block diagram of an induction module.

In order to provide electrical power to said induction coils 3, the induction hob 1 comprises multiple induction modules 10. Each induction module 10 may be coupled with one or more induction coils 1 in order to provide electrical power to said induction coils 1. FIG. 2 shows a schematic block diagram of an induction module 10. The induction module 10 comprises one or more induction generators 11. Each induction generator 11 may be adapted to power an induction coil 3. According to embodiments, the induction module 10 may comprise multiple induction generators 11 (e.g. two or four induction generators 11) for powering multiple induction coils 3. In addition, the induction module 10 may comprise a controller 12 (e.g. a microcontroller or microprocessor). Said controller 12 may be adapted to control said one or more induction generators 11 (e.g. the electrical power provided to the induction coils 3 and/or the frequency of the AC current provided to said induction coils 3).

Furthermore, the induction module 10 comprises a communication interface 13 for coupling the induction module 10 with the user interface 5 and one or more further induction modules 10. For example, the communication interface 13 may be adapted to be coupled with a communication bus 14 (e.g. serial line, SP, I2C, RS485 etc.) in order to exchange information between the user interface 5 and the induction modules 10. Based on said communication interface 13, the induction modules 10 may also be able to exchange information between each other.

For example, an induction module 10 may further comprise a bridge rectifier to supply the induction generator 11 with electrical power, a heat sink for removing heat from the electrical power elements (IGBTs or other powers switching elements, bridge rectifier, etc.). In addition, each induction module 10 may comprise a housing or enclosure in which upper-mentioned elements are arranged. Said housing may be adapted such that multiple induction modules 10 can be assembled side-by-side in order to form an induction module array (required for powering a plurality of induction coils of an induction coil array). Preferably, each induction module 10 may comprise a fan for cooling down the elements included in the induction module 10. Alternatively, an external fan may be used to cool down elements included in multiple induction modules 10.

According to embodiments, an induction module 10 may comprise all components required for powering one or more induction coils 3. So, when coupling the induction module 10 with one or more induction coils 3 and a user interface 5, a fully functional induction hob 1 is obtained.

Figure 3:
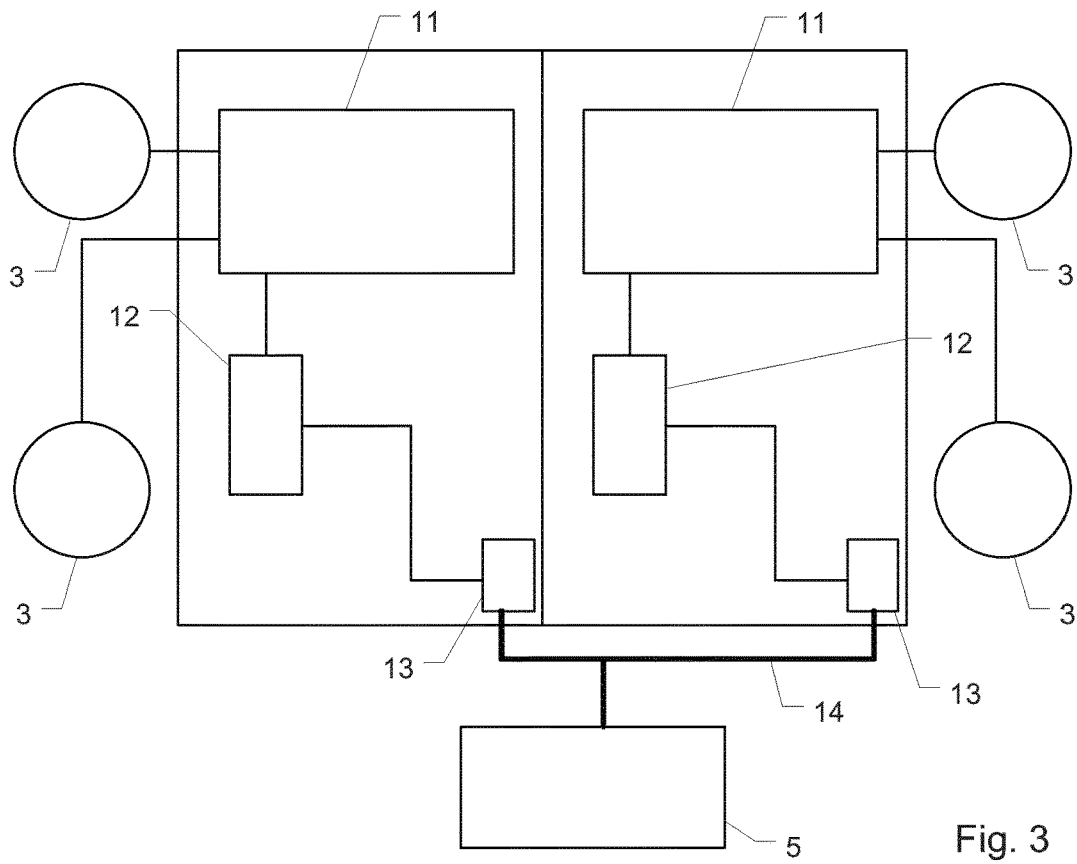
FIG. 3 shows an example arrangement of two induction modules coupled with induction coils and a user interface.

FIG. 3 shows an induction hob 1 comprising two induction modules 10. Each induction module may be coupled with a pair of induction coils 3 in order to provide electric power to said induction coils 3. Furthermore, the induction modules 10 are coupled with a user interface 5. More in detail, the communication interface 13 of the respective induction modules 10 is coupled with the user interface 5 via a communication bus 14. It is worth mentioning that the number of induction modules 10 and induction coils 3 is a mere example, i.e. according to other embodiments the induction hob 1 may comprise more induction modules 10 an/or the induction modules 10 may be configured to drive more or less induction coils 3 (e.g. 1 or 4).

The induction modules 10 included in the induction hob 1 are identical in view of their hardware. However, in order to improve the flexibility of usage of the induction modules 10, the induction modules 10 are software-configurable in order to be operated according to at least the first and a second configuration mode. The induction modules 10 may comprise a storage, register or similar means (e.g. a jumper) for defining the configuration mode according to which the respective induction module 10 is operated.

According to the first configuration mode, each induction module 10 included in the induction hob 1 is configured to communicate with the user interface 5 and directly receive information from said user interface 5 regarding the powering of the one or more induction coils 3 coupled with the induction module 10. In other words, all induction modules 10 are on the same hierarchical level and have the same functionality (no master-slave configuration). In said configuration, the user interface 5 directly transmits operating commands to each of said induction modules 10 by means of said communication bus 14. By using one or more induction modules 10 being configured according to said first configuration mode, an induction hob 1 can be obtained in which each induction coil 3 is associated with a certain fixed heating zone.

In order to use the same (i.e. hardware-identical) induction module 10 in a more sophisticated induction hob 1, e.g. an induction hob 1 with free configurable heating zones, the induction module 10 is adapted to be configured according to a second configuration mode. In said second configuration mode, a respective induction module 10 can be operated as a master induction module or a slave induction module in order to obtain a master-slave configuration of multiple induction modules 10 included in the induction hob 1.

In said master-slave configuration, one induction module 10 of the induction modules 10 included in an induction hob 1 is configured as master induction module and the further induction modules are configured as slave induction modules. Similar to the embodiment described before, the master induction module, the slave induction modules and the user interface 5 are connected with each other by means of a single communication bus 14. However, the slave induction modules do not directly exchange information with the user interface 5 but the information exchange is provided via the master induction module. Said master induction module directly communicates with the user interface 5 thereby receiving information regarding the heating zones requested by the user and the heating power to be provided to said heating zones. The master induction module is adapted to process the information received by the user interface 5 and provide operating information to each of said slave induction modules. Said operating information may comprise information regarding which induction coil 3 has to be activated, the electric power to be provided to the respective induction coil 3 and/or the AC current frequency to be applied to the respective induction coil 3. It is worth mentioning that—due to the usage of the communication bus 14—the master induction module as well as the slave induction modules receive the information provided by the user interface 5 via said communication bus 14. However, the slave induction modules do not process information received directly from the user interface 5, i.e. reject said information and do only process information received by said master induction module. In other words, from the viewpoint of the slave induction modules, the master induction module represents a central controlling module, i.e. an additional central controller (independent controller separate from the master induction module) for handling said master-slave configuration can be avoided.

The master induction module may be adapted to provide operation information to said slave induction modules based on a noise reduction algorithm. Said noise reduction algorithm may be configured to reduce acoustic noise by an appropriate selection of operating frequency and/or operating power of the respective induction coils 3. So, in other words, the master induction module is adapted to assign operating frequencies and/or operating power to the respective induction coils 3 coupled with the slave induction modules by calculating appropriate operating frequencies and/or operating power for the respective induction coils 3 and providing information regarding said appropriate operating frequencies and/or operating power to the respective slave induction modules using the communication bus 14.

In order to be able to control the slave induction modules by means of the master induction module, a periodic or regular information exchange between the master induction module and the slave induction modules may be performed. In other words, the master and slave induction modules exchange information using a message loop.

Figure 4:
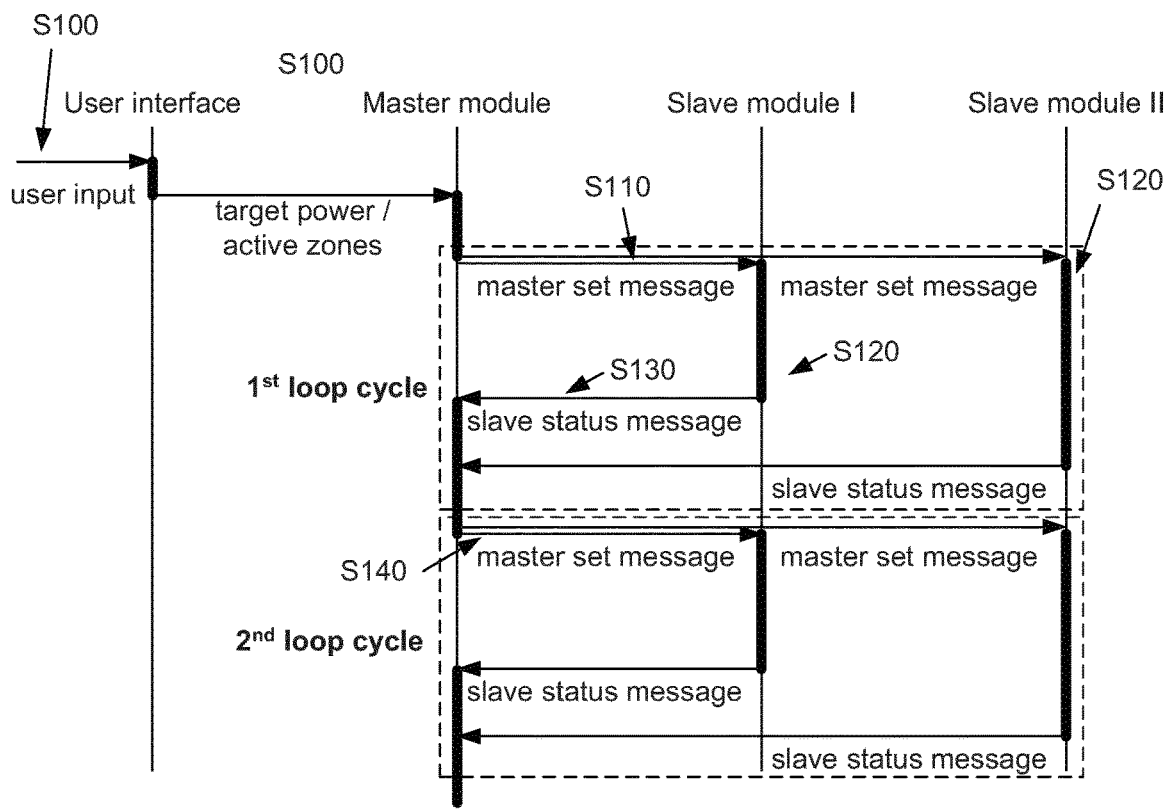
FIG. 4 shows a flow diagram illustrating the information flow in a master-slave configuration of multiple induction modules.

FIG. 4 shows a flow diagram illustrating the information flow between the user interface 5, the master induction module and the slave induction modules. In a first step (S100), a power request is received at the user interface 5. Said power request may be initiated by a user input at the user interface 5. Said user input may trigger a message transmitted from the user interface 5 to the master induction module via the communication bus 14. The message may comprise information regarding the target power to be provided at a respective heating zone (also referred to as user interface information). As mentioned before, said message is received at the master induction module as a well as the one or more slave induction modules. However, said message is only processed at the master induction module. The slave induction modules may ignore the message directly provided by the user interface 5.

After the receiving the user interface information, the master induction module provides operation information to said one or more slave induction modules (master set message, S110). The operation information may be a broadcast message sent to all slave induction modules at the same time. According to other embodiments, different operation information may be provided to the respective slave induction modules.

The operation information may include information regarding which induction coil 3 has to be activated, the operating power of the respective induction coil 3 and/or the AC current frequency to be provided to the respective induction coil. As already mentioned before, said operation parameters may be determined by the master induction module according to an acoustic noise reduction mechanism.

The slave induction modules may process the received operation information (S120). In case that a broad cost message is used for providing operation information to the slave induction modules, a respective slave induction module may extract information which is addressed to it and may operate the one or more induction generators 11 according to said information. More in detail, each slave induction module may be adapted to activate an induction coil 3 based on said received information and choose the operating power and/or the AC current frequency according to said received information. In addition, the slave induction modules may be adapted to transmit a status message back to the master induction module (also referred to as feedback message) (S130). Said status message may comprise information regarding the AC current frequency provided to the respective induction coils, the reached (electric) power, regulation parameters and/or zone status flags.

The master induction module receives said feedback message and may define—according to the acoustic noise reduction algorithm—the active coils, the target (electrical) power and/or the AC current frequency for the next message loop cycle. Said updated information may be provided to the slave induction modules using a further operation information message transmitted by the master induction module to the slave induction modules via said communication bus 14 (S140). Thus, the message exchange between the master induction module and the slave induction module(s) may be repeated.

In order to avoid a transmission bottleneck at the communication bus 14, the timing of the message is choosing by taking care of the communication bus load.

In case that the master induction module does not receive feedback messages of all slave induction modules, or the slave induction module's do not receive the operating information message provided by the master induction module after a defined timeout, the induction modules 10 are switched off.

Figure 5:
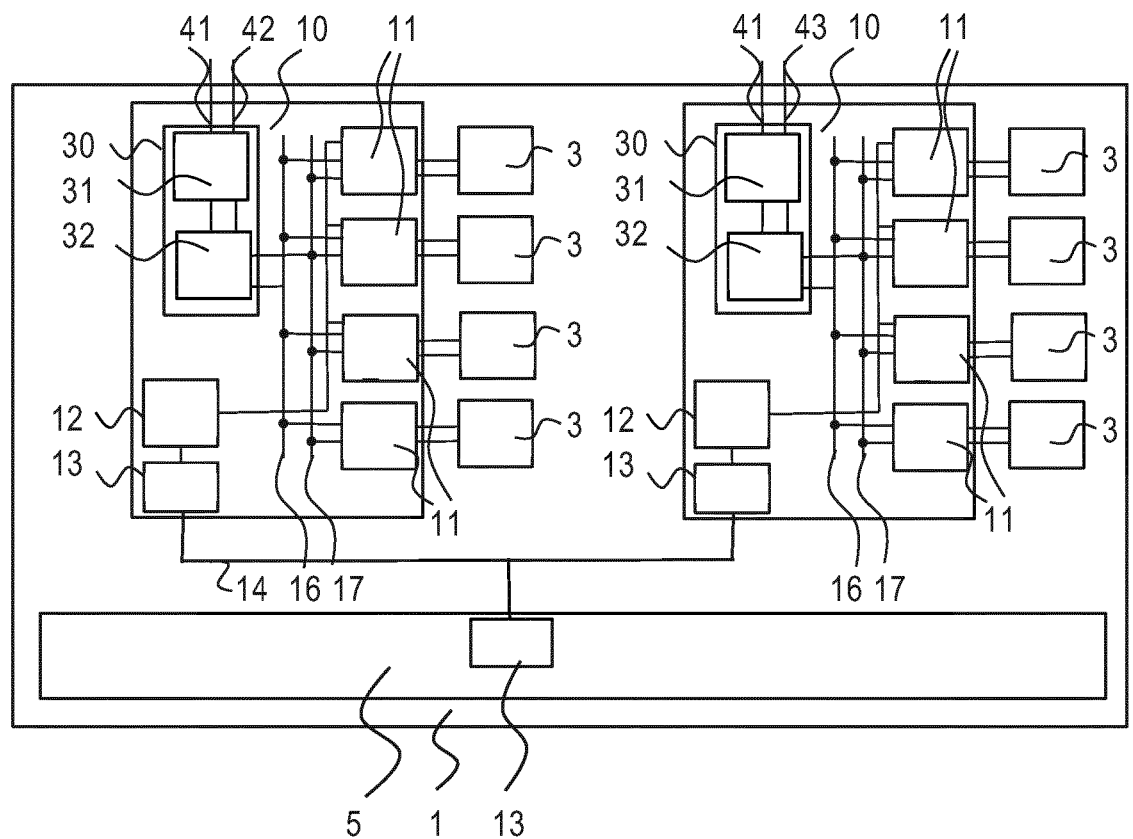
FIG. 5 shows an example schematic block diagram of a further induction hob.

FIG. 5 shows two induction modules 10 for powering eight electrical induction heating elements, constituted by induction coils 3, of an induction hob 1.

Each power module 10 in FIG. 5 comprises four heating power units, constituting heating frequency units and/or induction generators 11, each for providing electrical power, to one or two heating elements 3.

In general, FIG. 5 shows a power module 10, preferably an induction module for powering one, two, three, four, at least one, at least two, at least three or at least four heating elements, preferably electrical, radiant and/or induction heating elements, more preferably induction coils 3, of a cooking appliance, preferably a cooking hob, more preferably of a radiant or induction hob 1.

The power modules 10 can, as shown in FIG. 5 for one specific embodiment, comprise one, two or at least two heating power units 11, in particular three or at least three heating power units, more in particular four or at least four heating power units, preferably heating frequency units and/or induction generators 11, each for providing power, in particular electrical power, to one, two, three, at least one, at least two or at least three heating elements 3.

Each power module 10 in FIG. 5 comprises one controller 12 for controlling the heating power units 11.

The power module 10 comprises a communication interface 13 for coupling the power module 10 with a user interface 5.

In a first configuration mode, the power module 10 is adapted to be operated either according to a master module configuration or a slave module configuration.

In the master module configuration, the power module 10 is configured to receive user interface information from the user interface 5 and provide operation information to one or more slave power modules based on said user interface information.

In the slave module configuration, the power module 10 is configured to receive operation information from a master power module and operate the heating power unit 11 according to said operation information.

In said slave module configuration, the power module 10 does not consider information directly provided by the user interface 5.

The one or at least one controller 12 is adapted to operate the power module 10 at least according to the first configuration mode and a second configuration mode.

In the second configuration mode, the power module 10 is configured to directly communicate with the at least one user interface 5.

The communication interface 13 is configured to couple the power module 10 with the at least one user interface 5 and one or more further power modules 10.

The communication interface 13 is a bus interface for coupling the power module 10 with a communication bus 14.

The power module 10 comprises not shown storage means for storing information regarding operating the power module 10 according to master module configuration or slave module configuration.

The power module 10 comprises also a not shown housing, preferably a plastic housing, for housing the power module.

FIG. 1 and FIG. 5 show a cooking hob, more preferably an electric, radiant and/or induction hob, in particular for heating, cooking and/or boiling food by means of an electric and/or magnetic field.

The cooking appliance 1 in FIG. 5 comprises eight heating elements, preferably electrical, radiant and/or induction heating elements, more preferably induction coils 3.

The cooking appliance 1 comprises, in the embodiment in FIG. 5, two, preferably hardware-identical, power modules, preferably induction modules 10. The cooking appliance 1 can also comprise three, four or more than four, preferably hardware-identical, power modules, preferably induction modules 10.

In general, a cooking appliance 1 according to the invention is preferably a cooking hob, more preferably an electric, radiant and/or induction hob, in particular for heating, cooking and/or boiling food by means of an electric and/or magnetic field.

The cooking appliance 1 can comprise two, three, four, six, at least two, at least three, at least four or at least six heating elements, preferably electrical, radiant and/or induction heating elements, more preferably induction coils 3, as shown in FIG. 5 for a specific embodiment with eight heating elements 3.

The cooking appliance 1 can comprise two, three, four, six, at least two, at least three, at least four or at least six, preferably hardware-identical, power modules, preferably induction modules 10, as shown in FIG. 5 for one specific embodiment.

Each heating element 3 in FIG. 5 is coupled with one power module 10. The power modules 10 are configured to provide power, in particular electrical power, to one or more heating elements 3.

The cooking appliance 1 in FIG. 5 comprises one user interface 5 for receiving user input.

Each power module 10 comprises a communication interface 13 in order to couple the power module 10 with a communication media, in particular with a communication bus 14.

At least some of the power modules 10, preferably each power module 10, comprise a controller 13 adapted to operate the power module 10 according to a master-slave-concept.

One of said power modules 10 is configured as master power module, in particular master induction module, and at least one further power module 10 is configured as slave power module, in particular slave induction module.

A master power module 10 is adapted to receive user interface information from the at least one user interface 5 and provide operation information to said one or more slave power modules based on said user interface information.

A slave power module 10 is configured to receive operation information from said master power module and operate at least one, at least two or at least three heating power units, in particular induction generators 11, according to said operation information.

The user interface 5 is adapted to provide user interface information to the slave power module 10. Said slave power module 10 is adapted to reject or ignore said user interface information.

A single communication media, in particular a single communication bus 14, is used for communication between the master power module 10 and the user interface 5 and for communication between the master power module 10 and the slave power module 10.

The master power module 10 is configured to serve as a central controller for grouping heating elements 3 associated with one, two, three, at least two or at least three slave modules in order to form a common cooking area based on said group of heating elements 3.

The master power module 10 is further configured to determine operation information including target power and/or operating frequency of said one or more slave power modules based on said user interface information and/or based on a noise reduction algorithm.

The master power module 10 is further configured to transmit information regarding the heating elements 3 to be activated, the target power and/or the operating frequency to said one or more slave power modules.

The slave power module 10 is configured to process the information received from the master power module 10 and operate the heating elements 3 coupled with said slave module 10 according to said received information.

The slave power module 10 is adapted to provide feedback information to said master power module 10 in order to inform the master power module about the operation state of the slave power module.

Three power supply lines 41, 42 and 43 supply electrical power to the cooking appliance 1. The power supply lines comprise a first power supply line 42 and a second power supply line 43.

The power supply lines supply power by means of two AC voltage input signals with a first frequency, the AC voltage input signals comprising a first and a second voltage phase.

The power supply lines supply power by means of two AC voltage input signals with a first frequency, the two AC voltage input signals comprising a first and a second, in particular different, voltage phase.

The power modules 10 comprise at least a first power module and a second power module. Each power module can be provided as a power board, preferably comprising a power generating circuit and/or mounted on a printed circuit board PCB.

The first and the second power module 10 receive power from the first and the second power supply line by means of two AC voltage input signals.

Each power module 10 comprises a frequency processing unit 30.

Each power module 10 comprises a filter unit 20, in particular an electric or electronic filtering circuit and, a net filter and/or a line filter, for filtering the at least one AC voltage input signal, in particular for attenuating conducted radio frequencies and/or for reducing electromagnetic interference, EMI and/or for maintaining electromagnetic compatibility EMC.

Each power module 10 also comprises a rectifying unit 21, in particular a fullwave-rectifier and/or a bridge rectifier, for rectifying the at least one AC voltage input signal into a DC voltage signal.

Each DC voltage signal is supplied to two power rails 16, 17, wherein one of the two power rails defines a voltage reference potential.

Each power module comprises four heating power units 11, preferably generators and/or inverters, each provided preferably as a heating frequency unit for generating a heating frequency.

In general, each power module 10 can comprises two or at least two heating power units 11, in particular three or at least three heating power units, more in particular four or at least four heating power units, preferably generators and/or inverters, each provided preferably as a heating frequency unit for generating a heating frequency.

The heating power units 11 comprise at least a first and a second heating power unit. Each heating power unit 11 is supplied with electrical power by two power rails 16, 17. The heating power units 11, in particular the first and the second heating power unit, can output electrical signals with at least a second and a third frequency. Each of the second and the third frequency are at least 100 times higher than the first frequency.

Each heating power unit 11 can comprise one single power switch or two power switches for generating the heating frequency. In particular, one or two power switches can be provided as one or two integrated circuits, more in particular one or two IGBT's or relays.

Each heating power unit 11 can operate a quasi resonant circuit or a half bridge circuit.

Each power module 10 comprises a controller 12 to control the operation of the heating power units 11.

Each heating power unit 11 is connected or connectable to one heating element 3, in particular by means of at least one line and/or switching device.

Each heating power unit 11 is energizing at least one oscillating circuit comprising at least one inductive element and at least one capacitive element, in particular at least one coil 3 and at least one capacitor.

Each heating power unit 11 is generating a heating frequency in at least one heating element, in particular in the at least one inductive element or coil 3 as shown in FIG. 5.

Each of the two power modules 10 comprises at least two not shown, passive cooling elements, in particular heatsinks for cooling the at least two heating power units and/or the frequency processing unit, more in particular the rectifying unit 32.

Each of the two power modules 10 can comprise at least one not shown active cooling element, in particular at least one cooling fan, preferably for cooling the at least two passive cooling elements. The active cooling element can provide cool air for cooling the cooling elements, in particular the heatsinks.

At least one not shown shielding element, preferably against electric and/or magnetic fields and/or heat radiation, in particular a mica sheet, can be arranged above and/or below each heating element, in particular above and/or below each inductive element or coil, of each or at least one power module 10.

The cooking appliance 1 comprises a, preferably rectangular and/or glass ceramic, cooking surface 2. The user interface 5 comprises a display unit and an input unit, in particular for each power module 10.

Each display unit and each input unit can be combined to form at least one touch sensitive screen.

The user interface 13, in particular the display unit and the input unit, are arranged under, at or on the cooking surface 2.

Figure 6:
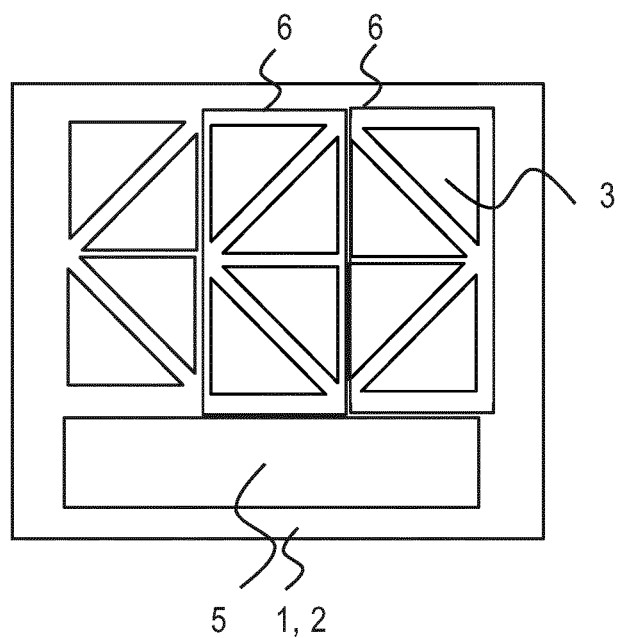
FIG. 6 shows an example schematic top view of a further induction hob comprising an induction coil array.

The heating elements 3 in FIG. 6 are arranged in a matrix form with at least two rows and three columns under the cooking surface 2. The at least two power modules 10 are arranged below the cooking surface 2 and/or below the heating elements 3.

In general, the heating elements 3 can be arranged in a matrix form with at least one, at least two or at least three rows and/or at least one, at least two or at least three columns under the cooking surface. The at least two power modules 10 are arranged below the cooking surface and/or below the heating elements 3.

At least two, preferably at least three, more preferably at least four, cooking zones 6 are arranged and/or arrangeable on the cooking surface 2.

Each cooking zone 6 can be constituted by two, three, four, at least two, at least three or at least four heating elements 3. Each heating element 3 of a cooking zone 6 is operated at the same heating level or with the same power.

The at least two, preferably at least three, more preferably at least four cooking zones 6 are adaptable to the position, shape and/or size of at least two, at least three or at least four not shown cooking vessels.

At least one, at least two or at least three cooking zones 6 receive or are configured to receive power from the first and the second power supply line 42, 43, by means of the first and the second power module 10.

The heating elements 3 are formed in such a way that they can be combined to a larger heating zone 6, in FIG. 6 in essentially triangular shape.

In general, the heating elements 3 in particular can be formed in such a way that they can be combined to a larger heating zone 6, more particular in at least essentially D-shaped, triangular, quadratic, circular and/or eliptical shape.

The heating elements 3 can be, in not shown embodiments, arranged, at least partially, in concentrical circuits and/or can comprise a linear and/or a rounded part, in particular with a m constant radius.

The heating elements 3 can be arranged on at least one not shown heating elements carrying unit, preferably on at least one induction coil carrier plate. The heating elements carrying unit is carrying and/or supporting ferrite elements and ferrite support elements for guiding the electrical and/or magnetic field of the heating elements 3.

The first power module 10 comprises a first communication interface 13 and the second power module 10 comprises a second communication interface 13. The user interface 5 comprises a third communication interface 13.

Each power module 10 is configured to communicate, in the slave module configuration, indirectly as a slave power module with the user interface 5 by means of another power module 10 forming a master power module.

Each power module 10 is configured to communicate, in the master module configuration, directly with the user interface 5.

In the master module configuration, the first communication interface 13 is communicating with the third communication interface, so that the first power module 10 communicates directly with the user interface 5 by means of the first communication interface and the third communication interface 13.

In the slave module configuration, the first communication interface is communicating with the second communication interface 13, so that the first power module 10 communicates indirectly with the user interface 5 via the second power module 10 by means of the first, the second and the third communication interface 13.

FIG. 1 to FIG. 6 also show a method for operating a cooking appliance, preferably a cooking hob, more preferably a radiant and/or induction hob 1, the cooking appliance 1 comprising two, three, four, six, at least two, at least three, at least four or at least six heating elements, preferably electrical, radiant and/or induction heating elements, more preferably induction coils 3, two, three, four, six, at least two, at least three, at least four or at least six, in particular hardware-identical, power modules, preferably induction modules 10, each heating element 3 being coupled with an or at least one power module, preferably induction power module 10 in order to provide, in particular electrical, power to one or more heating elements 3 and at least one user interface 5 for receiving user input, the method at least comprising the step of:
configuring one power module 10 of said power modules 10 as master power module and at least one further or each power module 10 as slave module.

The method further comprising at least one or more of the steps of:
after receiving a user input at the user interface 5, receiving user interface information at the master power module as step S100;
processing the user interface information at the master power module;
operating the at least one heating element 3 coupled with said one or more master power modules based on said operation information,
deriving operation information for said one or more slave power modules based on said user interface information;
transmitting operation information from the master power module to said one or more slave power modules as step S110; and/or
operating the at least one heating element 3 coupled with said one or more slave power modules based on said operation information.

Above, embodiments of a power module, especially induction module, according to the present invention as defined in the appended claims have been described. These should be seen as merely non-limiting examples. As understood by a skilled person, many modifications and alternative embodiments are possible within the scope of the invention.

LIST OF REFERENCE NUMERALS

1 induction hob
2 cooking surface
3 induction coil
4 piece of cookware
5 user interface
6 cooking zones
10 induction module
11 induction generator
12 controller
13 communication interface
14 communication bus
16, 17 power rails
30 frequency processing unit
31 filter unit
32 rectifying unit
41, 42, 43 power supply lines

The invention claimed is:

1. A power module for powering at least two heating elements of a cooking appliance, the power module comprising:
at least two heating power units, each for providing electrical power to the at least two heating elements; and
at least one controller for controlling the at least two heating power units;
a communication interface for coupling the power module with at least one user interface,
wherein, in a first configuration mode, the power module is adapted to be operated according to a master module configuration and a slave module configuration, and
wherein, in a second configuration mode, the power module is configured to directly communicate with the at least one user interface.

2. The power module according to claim 1,
wherein in the master module configuration, the power module is configured to receive user interface information from the at least one user interface and provide operation information to one or more slave power modules based on said user interface information;
wherein in the slave module configuration, the power module is configured to receive operation information from a master power module and operate the heating power unit according to said operation information; and
wherein in said slave module configuration, the power module does not consider information directly provided by the user interface.

3. The power module according to claim 1,
wherein the one or at least one controller is adapted to operate the power module at least according to the first configuration mode and a second configuration mode,
wherein in the second configuration mode, the power module is configured to directly communicate with the at least one user interface.

4. The power module according to claim 1, wherein the communication interface is configured to couple the power module with the at least one user interface and one or more further power modules, and
wherein the communication interface is a bus interface for coupling the power module with a communication bus and
comprising storage means for storing information regarding operating the power module according to master module configuration or slave module configuration and
comprising a plastic housing, for housing the power module.

5. A cooking appliance for heating, cooking or boiling food by means of an electric or magnetic field, the cooking appliance comprising:
at least two heating elements;
at least two hardware-identical, power modules according to claim 1, each heating element being coupled with at least one power module, the power modules being configured to provide electrical power to one or more heating elements; and
at least one user interface for receiving user input;
wherein each power module comprises a communication interface configured to couple the power module with a communication media, and
wherein at least some of the power modules comprise a controller adapted to operate the power module according to a master-slave-concept.

6. The cooking appliance according to claim 5,
wherein one of said power modules is configured as master power module and at least one further power module is configured as slave induction module;
wherein the master power module is adapted to receive user interface information from the at least one user interface and provide operation information to said one or more slave power modules based on said user interface information; and
wherein the slave power module is configured to receive operation information from said master power module and operate at least one heating power units according to said operation information.

7. Cooking appliance according to claim 5, wherein the at least one user interface is adapted to provide user interface information to said one or more slave power modules and said one or more slave power modules are adapted to reject or ignore said user interface information; and wherein a single communication bus is used for communication between the master power module and the user interface and for communication between the master power module and the one or more slave power modules.

8. The cooking appliance according to claim 7, wherein the master power module is configured to serve as a central controller for grouping heating elements associated with at least two slave power modules in order to form a common cooking area based on grouped heating elements;
wherein the master power module is configured to determine operation information including target power or operating frequency of said at least two slave power modules based on said user interface information or based on a noise reduction algorithm; and
wherein the master power module is configured to transmit information regarding the heating elements to be activated, the target power or the operating frequency to said one or more slave power modules, wherein the one or more slave power modules are configured to process the information received from the master power module and operate the one or more heating elements coupled with said slave module according to said received information.

9. The cooking appliance according to claim 5, wherein each slave power module is adapted to provide feedback information to said master power module in order to inform the master power module about an operation state of the slave power module.

10. The cooking appliance according to claim 5, further comprising at least one of the following features:
at least two power supply lines for supplying power to the cooking appliance,
the power supply lines comprising at least a first power supply line and a second power supply line,
wherein the power supply lines supply power by means of
at least one AC voltage input signal with a first frequency, the AC voltage input signal comprising a first voltage phase or
at least two AC voltage input signals with a first frequency, the at least two AC voltage input signals comprising at least a first voltage phase and a second voltage phase, wherein the second voltage phase is different from the first voltage phase.

11. The cooking appliance according to claim 10, further comprising at least one of the following features:
the power modules comprising at least a first power module and a second power module,
each power module being provided as a power board comprising a power generating circuit or being mounted on a printed circuit board (PCB),
the first and the second power modules receiving power from the first and the second power supply line by means of at least one AC voltage input signal,
at least one or each power module comprising a frequency processing unit for filtering the at least one AC voltage input signal, for attenuating conducted radio frequencies, for reducing electromagnetic interference (EMI) or for maintaining electromagnetic compatibility (EMC),
at least one or each power module comprising a rectifying unit for rectifying the at least one AC voltage input signal into a DC voltage signal,
the DC voltage signal being supplied to two power rails, wherein one of the two power rails defines a voltage reference potential.

12. The cooking appliance according to claim 10, comprising at least one or more of the following features:
each power module comprising at least two heating power units, each provided as a heating frequency unit for generating a heating frequency,
the at least two heating power units comprising at least a first and a second heating power unit,
each heating power unit being supplied with electrical power by two power rails,
wherein the at least two heating power units output electrical signals with at least a second and a third frequency,
wherein each of the second and the third frequency are at least 100 times higher than the first frequency.

13. The cooking appliance according to claim 5, comprising at least one or more of the following features:
at least one or each heating power unit comprising one single power switch or two power switches for generating the heating frequency,
at least one or each heating power unit operating a quasi resonant circuit or a half bridge circuit,
at least one or each power module comprising at least one controller to control the operation of the heating power units.

14. The cooking appliance according to claim 5, comprising at least one or more of the following features:
at least one or each heating power unit being connected or connectable to at least one heating element,
at least one or each heating power unit energizing at least one oscillating circuit comprising at least one inductive element and at least one capacitive element,
at least one or each heating power unit generating a heating frequency in at least one heating element.

15. The cooking appliance according to claim 5, comprising at least one or more of the following features:
at least one or each of the at least two power modules comprising at least two passive, cooling elements for cooling the at least two heating power units or the frequency processing unit,
at least one or each of the at least two power modules comprising at least one active cooling element for cooling the at least two passive cooling elements,
the or at least one active cooling element providing cool air for cooling the cooling elements.

16. The cooking appliance according to claim 5, comprising at least one or more of the following features:
at least one shielding element configured to shield against electric, magnetic fields or heat radiation, and being arranged above or below each heating element of each or at least one power module.

17. The cooking appliance according to claim 5, comprising at least one or more of the following features:
a rectangular or glass ceramic, cooking surface,
one or at least one user interface comprising a display unit and an input unit for each power module,
the or each display unit and the or each input unit being combined to form at least one touch sensitive screen,
the at least one user interface being arranged under, at or on the cooking surface.

18. The cooking appliance according to claim 5, comprising at least one or more of the following features:
the heating elements being arranged in a matrix form with at least one row or at least one column under the cooking surface,
the at least two power modules being arranged below the cooking surface or below the heating elements.

19. The cooking appliance according to claim 10, comprising at least one or more of the following features:
- at least two cooking zones being arranged on the cooking surface,
- each cooking zone being constituted by two, three, four, at least two, at least three or at least four heating elements, wherein each heating element of a cooking zone is operated at the same heating level or with the same power,
- the at least two cooking zones being adaptable to the position, shape or size of at least one cooking vessel,
- at least one receiving or being configured to receive power from the first and the second power supply line by means of the first and the second power module.

20. The cooking appliance according to claim 5, comprising at least one or more of the following features:
- the heating elements being formed in such a way that they can be combined to a larger heating zone having a D-shaped, triangular, quadratic, circular or elliptical shape,
- the heating elements being arranged, at least partially, in concentrical circuits or comprising a linear or a rounded part with a constant radius,
- the two, three, four, at least two, at least three or at least four heating elements being arranged on at least one heating elements carrying unit,
- the heating elements carrying unit carrying or supporting ferrite elements and ferrite support elements for guiding an electrical or magnetic field of the heating elements.

21. The cooking appliance according to claim 5, comprising at least one or more of the following features:
- the first power module comprising a first communication interface and the second power module comprising a second communication interface,
- the or a user interface comprising a third communication interface,
- each power module being configured to communicate, in the slave module configuration, indirectly as a slave power module with the user interface by means of another power module forming a master power module,
- each power module being configured to communicate, in the master module configuration, directly with the user inter-face,
- in the master module configuration, the first communication interface communicating with the third communication interface,
- so that the first power module communicates directly with the user interface by means of the first communication interface and the third communication interface,
- in the slave module configuration, the first communication interface communicating with the second communication interface,
- so that the first power module communicates indirectly with the user interface via the second power module by means of the first, the second and the third communication interface.

22. A method for operating the cooking appliance according to claim 5, the method at least comprising the steps of:
- configuring, in a first operation mode, one power module of said power modules as master power module and at least one further or each power module as slave module
- configuring, in a second configuration mode, one, at least one or each power module of said power modules to communicate directly with the at least one user interface.

23. The method according to claim 22, further comprising at least one or more of the steps of:
- after receiving a user input at the user interface, receiving user interface information at the master power module;
- processing the user interface information at the master power module;
- operating the at least one heating element coupled with said one or more master power modules based on said operation information,
- deriving operation information for said one or more slave power modules based on said user interface information;
- transmitting operation information from the master power module to said one or more slave power modules; and
- operating the at least one heating element coupled with said one or more slave power modules based on said operation information.

24. The power module according to claim 1,
- wherein in the master module configuration, the power module is configured to receive user interface information from the at least one user interface and provide operation information to one or more slave power modules based on said user interface information;
- wherein in the slave module configuration, the power module is configured to receive operation information from a master power module and operate the heating power unit according to said operation information; and
- wherein the operation information includes information regarding a target power or an operating frequency to said one or more slave power modules.

25. A plurality of power modules for powering at least two heating elements of a cooking appliance, each of the plurality of power modules comprising:
- at least two heating power units, each for providing electrical power to the at least two heating elements;
- at least one controller for controlling the at least two heating power units; and
- a communication interface for coupling the plurality of the power modules with at least one user interface,
- wherein, in a first configuration mode, at least two of the plurality of power modules are adapted to be operated either according to a master module configuration or a slave module configuration, and
- wherein, in a second configuration mode, at least two of the plurality of power modules are configured to directly communicate with the at least one user interface.

* * * * *